(12) United States Patent
Ritter et al.

(10) Patent No.: US 12,224,579 B2
(45) Date of Patent: Feb. 11, 2025

(54) ESD PROTECTION DEVICE

(71) Applicant: NEXPERIA B.V., Nijmegen (NL)

(72) Inventors: Hans-Martin Ritter, Nijmegen (NL); Steffen Holland, Nijmegen (NL); Markus Mergens, Nijmegen (NL)

(73) Assignee: Nexperia BV, Nijmegen (NL)

( * ) Notice: Subject to any disclaimer, the term of this patent is extended or adjusted under 35 U.S.C. 154(b) by 203 days.

(21) Appl. No.: 18/153,726

(22) Filed: Jan. 12, 2023

(65) Prior Publication Data

US 2023/0223750 A1    Jul. 13, 2023

(30) Foreign Application Priority Data

Jan. 12, 2022  (EP) .................................... 22151122

(51) Int. Cl.
| | | |
|---|---|---|
| *H02H 9/04* | (2006.01) | |
| *H01L 23/00* | (2006.01) | |
| *H01L 23/495* | (2006.01) | |
| *H01L 25/16* | (2023.01) | |
| *H01L 25/18* | (2023.01) | |

(52) U.S. Cl.
CPC ....... *H02H 9/046* (2013.01); *H01L 23/49575* (2013.01); *H01L 24/48* (2013.01); *H01L 24/49* (2013.01); *H01L 25/162* (2013.01); *H01L 25/18* (2013.01); *H01L 24/06* (2013.01); *H01L 2224/0603* (2013.01); *H01L 2224/48137* (2013.01); *H01L 2224/48245* (2013.01); *H01L 2224/49112* (2013.01); *H01L 2924/13034* (2013.01)

(58) Field of Classification Search
CPC ...................................................... H02H 9/046
See application file for complete search history.

(56) References Cited

U.S. PATENT DOCUMENTS

| | | | | |
|---|---|---|---|---|
| 6,016,002 A | * | 1/2000 | Chen | H01L 27/0266 |
| | | | | 257/355 |
| 6,671,153 B1 | * | 12/2003 | Ker | H01L 27/0262 |
| | | | | 361/111 |
| 2011/0166847 A1 | * | 7/2011 | Li | G06F 30/367 |
| | | | | 703/13 |
| 2012/0080717 A1 | * | 4/2012 | Abou-Khalil | H01L 29/747 |
| | | | | 257/121 |
| 2012/0293904 A1 | * | 11/2012 | Salcedo | H02H 9/046 |
| | | | | 361/111 |

(Continued)

FOREIGN PATENT DOCUMENTS

WO     2011156233 A1    12/2011

OTHER PUBLICATIONS

Extended European Search Report for corresponding European application EP22151122.3, 9 pages dated Jun. 15, 2022.

*Primary Examiner* — Scott Bauer

(74) *Attorney, Agent, or Firm* — Ruggiero McAllister & McMahon LLC

(57) ABSTRACT

An electrostatic discharge (ESD), protection device is provided. In accordance with the present disclosure, an ESD protection device is provided that includes a series connection of a first unit having strong snapback and low series capacitance and a second high-voltage unit that displays a relatively high holding/trigger voltage to ensure latch up and improper triggering of the ESD protection device while at the same time providing high-voltage operation with low capacitive loading.

18 Claims, 5 Drawing Sheets

(56) References Cited

U.S. PATENT DOCUMENTS

| | | | |
|---|---|---|---|
| 2015/0270257 A1* | 9/2015 | Edwards | H01L 29/0649 |
| | | | 257/491 |
| 2016/0336744 A1* | 11/2016 | Parthasarathy | H02H 9/046 |
| 2017/0077082 A1* | 3/2017 | Marreiro | H01L 27/0262 |
| 2017/0163031 A1* | 6/2017 | Jou | H02H 9/04 |
| 2017/0213816 A1 | 7/2017 | Lai | |
| 2018/0331090 A1 | 11/2018 | de Raad et al. | |
| 2020/0381417 A1 | 12/2020 | Salcedo et al. | |

* cited by examiner

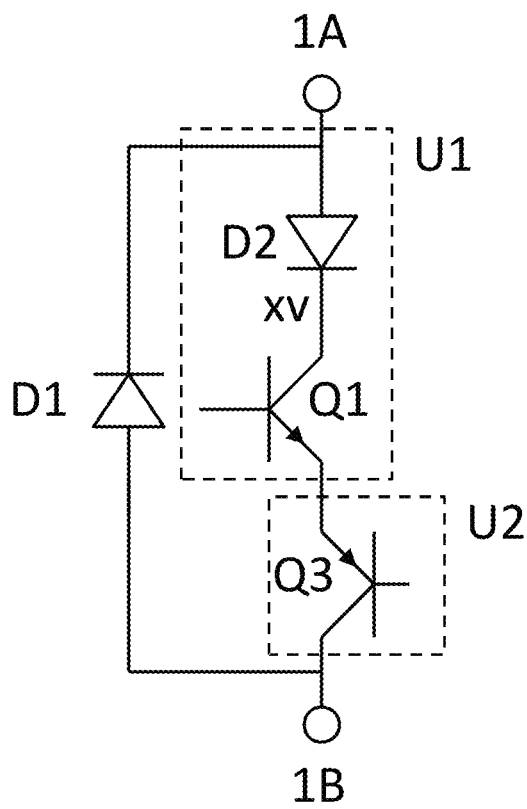
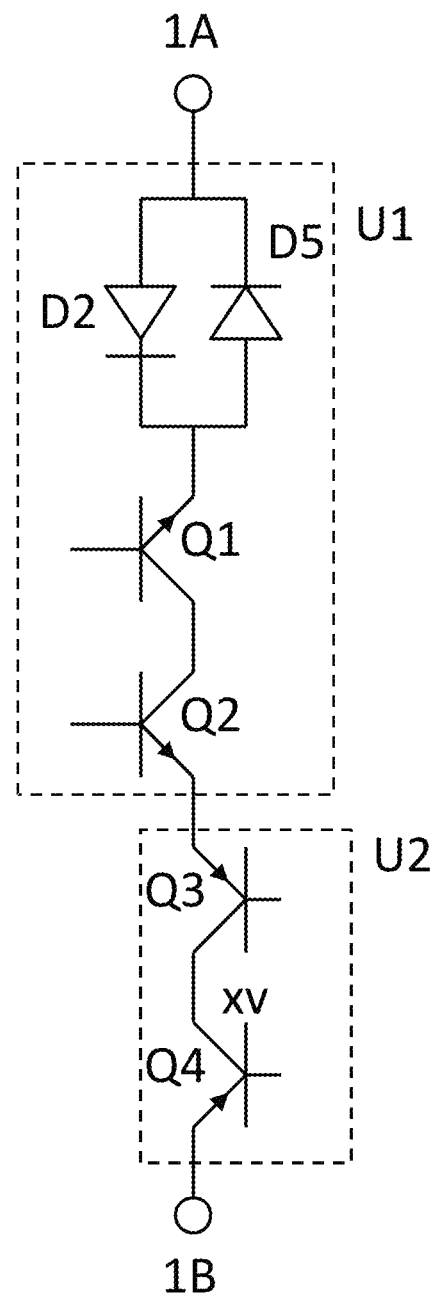
FIG. 4A
FIG. 4B

ESD PROTECTION DEVICE

CROSS-REFERENCE TO RELATED APPLICATIONS

This application claims the benefit under 35 U.S.C. § 119(a) of European Application No. 22151122.3 filed Jan. 12, 2022, the contents of which are incorporated by reference herein in their entirety.

BACKGROUND

1. Field of the Disclosure

Aspects of the present disclosure relate to an electrostatic discharge, ESD, protection device. Further aspects of the present disclosure relate to a multi-channel ESD protection device and to a packaged ESD protection device. Other aspects of the present disclosure relate to a system-in-a-package and to an electronic device, both comprising the ESD protection device.

2. Description of the Related Art

To withstand ESD events, electronic devices often comprise or are connected to dedicated ESD protection devices. These latter devices are configured to provide an electrical path between the electronic device, more specifically an ESD sensitive node thereof, and ground to ensure that excessively high currents and/or voltages occurring at the ESD sensitive node during an ESD event can be prevented. Depending on the application of the electronic device, the ESD protection device should meet different requirements.

The following three ESD requirements typically pose a serious design challenge for effective ESD protection on-chip as well as on system-level. Firstly, ultra-high ESD performance specifications such as system-level IEC41000-4-2 with specification values ranging from 8 to 25 kV are common in automotive industry. Such specifications result in fast nanosecond peaks up to currents of more than 100 As while peaks of the "energetic" human body model-like pulse can go up to almost 50 As.

Secondly, high-voltage automotive applications often demand a high off-state level of the ESD protection device to avoid wrong triggering during normal operation conditions. This results in a requirement for a high ESD trigger and holding voltage ranging from 15V up to 200V depending on the specific product application. In conjunction with the high ESD peak currents inherent to the abovementioned typical system-level ESD specifications, several kilowatts of power can be dissipated in the protection device during ESD stress. Moreover, application of high-voltage snapback devices based on NPN bipolar transistors with deep snapback are critical since those are frequently prone to early filamentation and thus degradation in the high current snapback regime.

Thirdly, low-capacitance radiofrequency, RF, applications such as Serdes, Ethernet, HDMI, USB, and the like limit the maximum permissible capacitive loading of the ESD protection device to relatively low values typically below 1 pF in order to avoid detrimental interference with the fast RF signal for example due to insertion/return loss or harmonic distortions. Aggressive RF designs do even restrict the maximum level below 100 fF at the RF signal lines.

SUMMARY

Aspects of the present disclosure relate to an ESD protection device that provides a solution for at least some of the abovementioned design challenges in one ESD protection architecture. Typically, those solution address high-speed automotive applications, such as Ethernet>1 Gbit/s or Serdes>10 Gbit/s, which require a low capacitive loading and relatively high voltage levels.

According to an aspect of the present disclosure, an ESD protection device is provided that comprises a node terminal configured to be connected to a node of a circuit to be protected, a reference terminal configured to be connected to a reference voltage such as ground, and a series connection of a first unit and a second unit arranged in between the node terminal and the reference terminal.

The ESD protection device is configured to provide a conductive path between the node terminal and the reference terminal and through the series connection in case of an ESD event occurring on the node to be protected.

The first unit has I-V characteristics that display a first snapback that is described by a first trigger voltage and a first holding voltage for a first current flow from one of the node terminals and the reference terminal to the other of the node terminal and the reference terminal. The second unit comprises a junction that is reverse biased for this first current flow. The reverse biased junction has I-V characteristics that are described by a second trigger voltage, and if these I-V characteristics display a second snapback, also by a second holding voltage.

The first unit has a first series capacitance and the second unit a second series capacitance, wherein the second series capacitance is preferably at least 3 times greater than the first series capacitance.

A magnitude of the second trigger voltage, or of the second holding voltage if the I-V characteristics of the second unit display the second snapback, is preferably at least 3 times greater than a magnitude of the first holding voltage.

An example of an ESD protection device 1 as described above is illustrated in FIG. 1A. FIG. 1B illustrates an embodiment of an electronic device 30 according to an aspect of the present disclosure comprising electronic circuitry 4 having an ESD sensitive node N to which ESD protection device 1 is connected.

ESD protection device 1 comprises a first unit 2 in series with a second unit 3. First unit 2 comprises a first terminal 2A and a second terminal 2B, and second unit 3 comprises a first terminal 3A and a second terminal 3B. First unit 2 has a series capacitance C1 in between terminals 2A, 2B and second unit 3 has a series capacitance C2 in between terminals 3A, 3B that is for example at least 3 times greater than the first series capacitance.

First terminal 2A forms a node terminal 1A of device 1 and second terminal 3B forms a reference terminal 1B of device 1. However, the present disclosure equally relates to embodiments wherein first terminal 2A forms a reference terminal 1B of device 1 and second terminal 3B a node terminal 1A of device 1.

FIG. 1A illustrates the I-V characteristics of units 2, 3 separately. For example, the I-V characteristics of unit 2 display snapback, which is described by a first trigger voltage Vt1 and a first holding voltage Vh1. The I-V characteristics of unit 3 do not display snapback. Instead, the I-V characteristics are described by a second trigger voltage Vt2. The I-V characteristics correspond to those of a reverse biased junction.

The series combination of units 2, 3 results in the I-V characteristics shown in the bottom right corner of FIG. 1A. As shown, the I-V characteristics are described by a trigger voltage Vt1+Vt2 and by a holding voltage Vh1+Vt2. Here, a magnitude of second trigger voltage Vt2 is preferably at least 3 times greater than a magnitude of first holding voltage Vh1.

ESD protection device 1 is connected to ESD sensitive node N of electronic device 30. The maximum operational voltage occurring at node N during normal operation equals Vmax, and the minimum voltage level at node N that would result in damage to electronic device 30 equals Vbreak.

As shown in FIG. 1A, during an ESD event, snapback can be observed in unit 2. For high-voltage applications, first holding voltage Vh1 is generally lower than Vmax. Without unit 3, unit 2 would latch in the sense that after having been triggered, unit 2 will remain in snapback operation even though the voltages at node N are at normal levels again. Relatively high second trigger voltage Vt2 adds to the effective holding voltage of ESD protection device 1, which is equal to Vh1+Vt2, such that inappropriate latching of unit 2 after an ESD event is avoided. At the same time the effective trigger voltage of device 1, which is equal to Vt1+Vt2, is lower than Vbreak. Consequently, ESD protection device 1 will be triggered and provide a current path to ground before voltage level Vbreak is reached at ESD sensitive node N.

The strong snapback device used for unit 2 is typically realized using a lateral semiconductor device that is characterized by a relatively small series capacitance. However, this device is generally not able to dissipate large amounts of power. Second unit 3 is typically realized using a high-power device. This device is typically realized using a vertical semiconductor device, which typically has a relatively high series capacitance. By arranging units 2, 3 in series, a relatively low effective series capacitance is obtained for ESD protection device 1 that is equal to C1C2/(C1+C2), while at the same time a sufficiently high effective trigger voltage can be obtained to avoid triggering under normal operating conditions, and a sufficiently high effective holding voltage can be obtained to avoid latching.

The I-V characteristics of second unit 3 may display a second snapback that can be described by the second trigger voltage and the second holding voltage. However, this second snapback is moderate at most with a ratio between the second trigger voltage and the second holding voltage being smaller than 2, preferably smaller than 1.5. The resulting I-V characteristics of a device in which second unit 3 has a second snapback would be similar to that shown in the bottom right corner of FIG. 1A with the exception that Vh1+Vt2 would be replaced with Vh1+Vh2.

As described above, according to an aspect of the present disclosure, low-capacitance and high-power design targets are separated using a series architecture thus overcoming the design conflicts common to a single high-voltage RF transistor design with strong snapback.

The first unit may comprise a silicon-controlled rectifier, or an electrical equivalent thereof. Alternatively, the first unit may comprise a first open base NPN bipolar transistor and a first diode that is arranged in forward with respect to the first current flow. In this case, the first current flow may correspond to a current flow through the first diode and from the collector to the emitter of the first open base NPN bipolar transistor. The first diode typically has a low series capacitance mitigating the relatively high series capacitance the first open base NPN bipolar transistor may have.

Both examples of the first unit described above can be combined with a bypass diode that is arranged in parallel to the series connection, wherein the bypass diode is arranged in reverse with respect to the first current flow. Using the bypass diode renders the ESD protection device a unilateral device.

The second unit may comprise a stack of second diodes arranged in reverse with respect to the first current flow. Alternatively, the second unit may comprise a first open base PNP bipolar transistor, wherein the first current flow corresponds to a current flow from the emitter to the collector of the first open base PNP bipolar transistor. Alternatively, the second unit may comprise a second PNP bipolar transistor of which the emitter and base are interconnected, wherein the first current flow corresponds to a current flow from the base and emitter to the collector of the second PNP bipolar transistor. Alternatively, the second unit may comprise a second NPN bipolar transistor of which the emitter and base are interconnected, wherein the first current flow corresponds to a current flow from the collector base to base and/or emitter of the second NPN bipolar transistor.

The ESD protection device may be a bi-directional ESD protection device. For example, for a second current flow from said other of the node terminal and the reference terminal to said one of the node terminal and the reference terminal, the first unit may have I-V characteristics that display a third snapback that is described by a third trigger voltage and a third holding voltage, and the second unit may comprise a second junction that is reverse biased for the second current flow. This second reverse biased junction may have I-V characteristics that are described by a fourth trigger voltage, and if these I-V characteristics display a fourth snapback, also by a fourth holding voltage. A magnitude of the fourth trigger voltage, or of the fourth holding voltage if the I-V characteristics of the second unit display the fourth snapback, is preferably at least 3 times greater than a magnitude of the third holding voltage. If the I-V characteristics of the second unit display the fourth snapback, a ratio between the fourth trigger voltage and the fourth holding voltage is preferably smaller than 2, more preferably smaller than 1.5.

The first unit may comprise a bi-directional silicon-controlled rectifier, or an electrical equivalent thereof.

Alternatively, the first unit may comprise a third open base NPN bipolar transistor and a third diode that is arranged in forward with respect to the second current flow, wherein said second current flow corresponds to a current flow from the collector to the emitter of the third open base NPN bipolar transistor and through the third diode.

For the bi-directional ESD protection device, the second unit may comprise a stack of fourth diodes arranged in reverse with respect to a current from the node terminal to the reference terminal. Alternatively, the second unit may comprise a third open base PNP bipolar transistor, wherein the second current flow corresponds to a current flow from the emitter to the collector of the third open base PNP bipolar transistor. Alternatively, the second unit may comprise a second PNP bipolar transistor of which the emitter and base are interconnected, wherein the second current flow corresponds to a current flow from the base to the collector of the second PNP bipolar transistor.

A ratio between the first trigger voltage and the second trigger voltage may lie in a range between 0.5 and 5 and/or a ratio between the third trigger voltage and the fourth trigger voltage may lie in a range between 0.5 and 5.

The first trigger voltage may lie in a range between 5 and 200V, and the first holding voltage may lie in a range between 0.8 and 15V and/or the third trigger voltage may lie in a range between 5 and 200V, and the third holding voltage may lie in a range between 0.8 and 15V.

The second trigger voltage may lie in a range between 5 and 100V, and/or the fourth trigger voltage may lie in a range between 5 and 100V.

A ratio between the second trigger voltage and the second holding voltage may lie in a range between 1 and 2 and/or a ratio between the fourth trigger voltage and the fourth holding voltage may lie in a range between 1 and 2.

According to a further aspect of the present disclosure, a multi-channel ESD protection device is provided that comprises a plurality of ESD protection devices, wherein the node terminals of said plurality of ESD protection devices are connected to a plurality of nodes to be protected, and wherein the reference terminals of said plurality of ESD protection device are connected to a common reference terminal. The second units of the plurality of ESD protection devices are formed by a single second unit that is shared among the plurality of ESD protection devices.

According to a further aspect of the present disclosure, a packaged ESD protection device is provided that comprises a package body, at least one first package lead and a package ground lead partially extending outside the package body, and the ESD protection device or the multi-channel ESD protection device as described above, arranged inside the package body, of which the reference terminal is connected to the package ground lead and wherein the node terminal(s) is/are connected to the at least one first package lead.

The first unit of the ESD protection device or the first units of the multi-channel ESD protection device can be realized on a respective first semiconductor die and the second unit on a separate second semiconductor die, wherein the first semiconductor die(s) comprise(s) a substrate having arranged thereon a first die terminal forming the first terminal of the respective first unit and a second die terminal forming the second terminal of the respective first unit, wherein the second semiconductor die comprises a conductive substrate having a third die terminal forming the first terminal of the second unit arranged on a first side of the second semiconductor die and having a fourth die terminal forming the second terminal of the second unit arranged on a second side of the second semiconductor die opposite to the first side of the second semiconductor die, wherein the first die terminal(s) is/are electrically connected, for example using a bondwire, to the first package lead(s), wherein the second die terminal(s) is/are electrically connected, for example using a bondwire, to the third die terminal, and wherein the second semiconductor die is mounted with its fourth die terminal on the package ground lead.

According to a further aspect of the present disclosure, a system-in-a-package is provided that comprises the ESD protection device or the multi-channel ESD protection device as described above. The first unit of the ESD protection device can be realized on a first semiconductor die and the second unit on a separate second semiconductor die, wherein the first semiconductor die comprises a substrate having arranged thereon a first die terminal forming the first terminal of the first unit and a second die terminal forming the second terminal of the first unit. The second semiconductor die may comprises a conductive substrate having a third die terminal forming the first terminal of the second unit arranged on a first side of the second semiconductor die and having a fourth die terminal forming the second terminal of the second unit arranged on a second side of the second semiconductor die opposite to the first side of the second semiconductor die, wherein the second semiconductor die is mounted with its third die terminal on the second die terminal of the first semiconductor die.

The system-in-a-package may further comprise a package body, and at least one first package lead and a package ground lead partially extending outside the package body. The first die terminal can be connected to the first package lead, and the fourth die terminal can be connected to the package ground lead.

According to a further aspect of the present disclosure, an electronic device is provided that comprises an electrostatic discharge, ESD, sensitive electric circuit having an ESD sensitive node, such as an input terminal, output terminal, data terminal or the like. The electronic device further comprises the ESD protection device as described above, wherein the ESD sensitive node is electrically connected to the node terminal of the ESD protection device, and wherein the reference terminal of the ESD protection device is electrically grounded at least during operation.

BRIEF DESCRIPTION OF DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIGS. 4A and 4B illustrate a third embodiment of a unidirectional ESD protection device and a fourth embodiment of a bi-directional ESD protection device, respectively, according to an aspect of the present disclosure;

DETAILED DESCRIPTION

In FIGS. 2-6, the first units of the ESD protection devices are referred to using reference sign U1 and the second units using reference sign U2. For example, the unidirectional ESD protection device shown in FIG. 2A, comprises a silicon-controlled rectifier, SCR, as first unit U1. The SCR comprises an PNP bipolar transistor Q1 and an NPN bipolar transistor Q2. It further comprises a resistor R1 connected in between node terminal 1A and the base of Q1, and a resistor R2 connected in between the base of Q2 and the second terminal of first unit U1. The second terminal of first unit U1 is connected to the emitter of high-voltage PNP bipolar transistor Q3 of which the base and emitter are shorted. Q3 therefore forms a N-P junction. Moreover, the collector of Q3 is connected to reference terminal 1B.

Figure 1A:
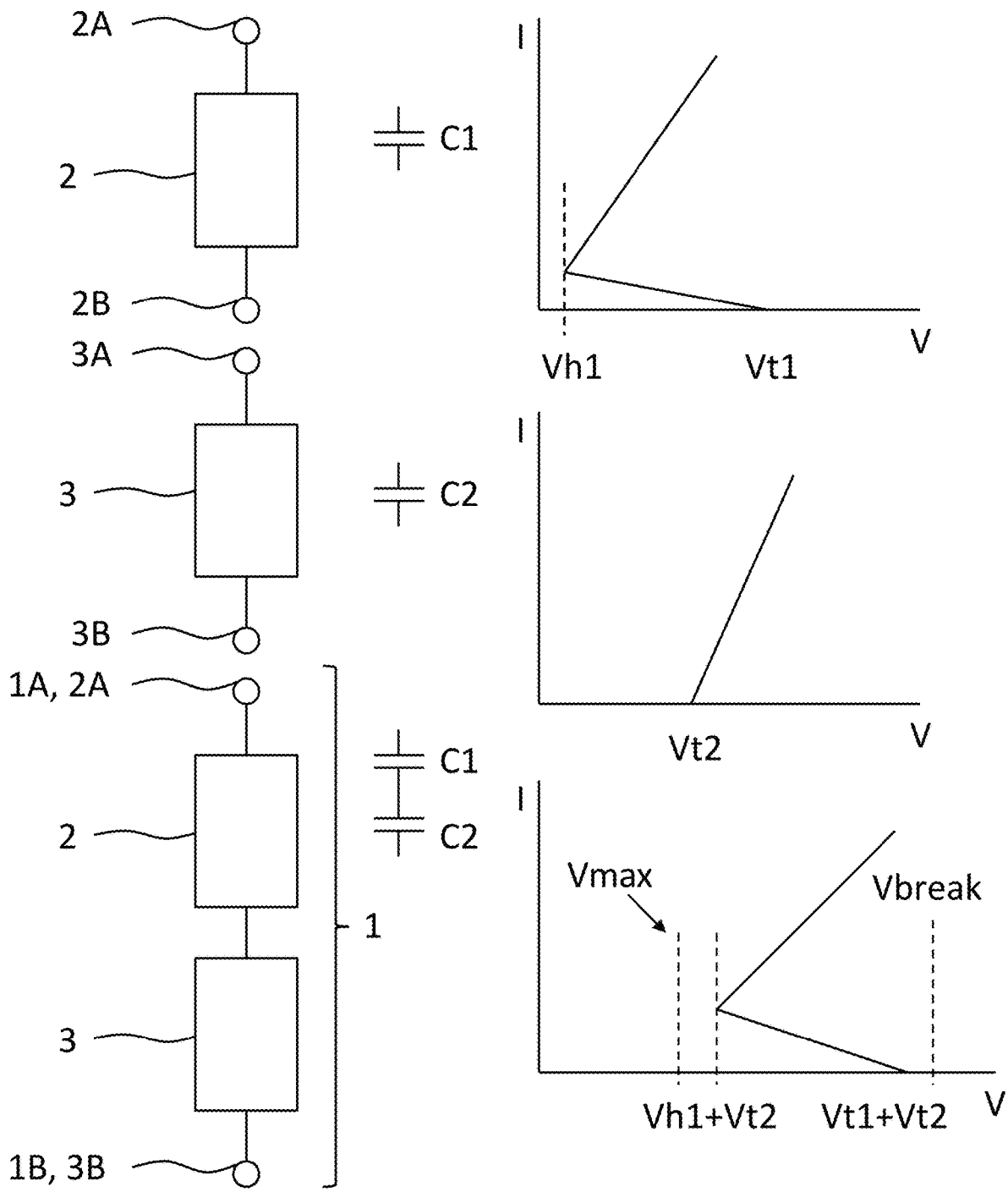
FIGS. 1A and 1B illustrate an ESD protection device and an electronic device comprising such ESD protection device according to an aspect of the present disclosure.
Figure 1B:
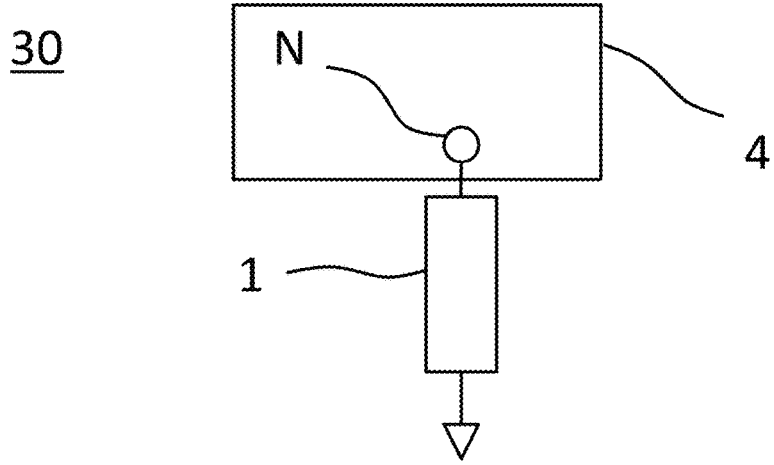

The SCR has I-V characteristics like those shown in the upper right corner of FIG. 1A, and Q3 has I-V characteristics like those shown in the center right of FIG. 1A.

Bypass diode D1 enables unidirectional operation of the ESD protection device. More in particular, for ESD events in which a positive voltage will appear on node terminal 1A, the ESD protection device will be triggered and an electrical path will be opened in between node terminal 1A and ground through the SCR and Q3. For ESD events in which a negative voltage will appear on node terminal 1A, the ESD protection device will not be triggered. However, current is allowed to flow between ground and node terminal 1A via bypass diode D1.

Figure 2A:
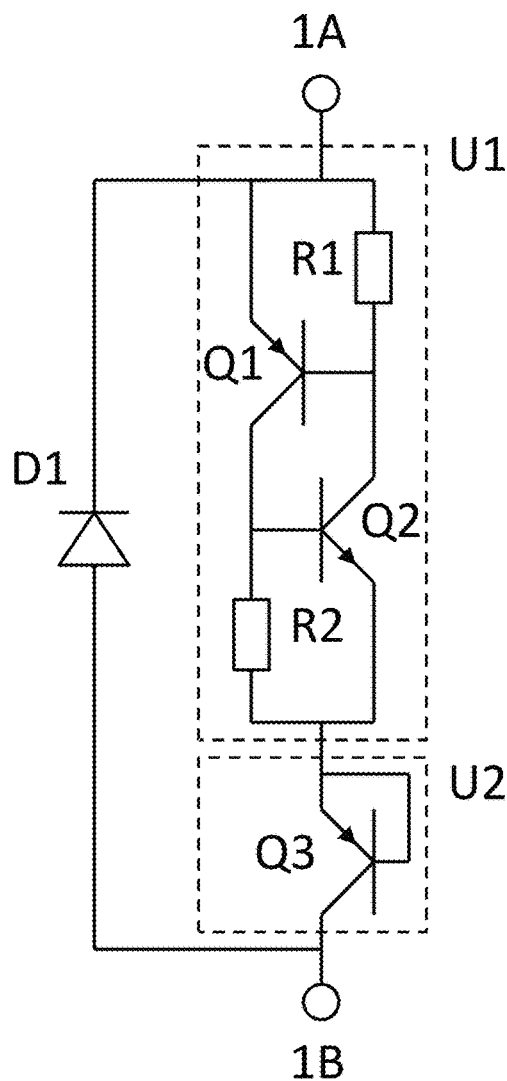
FIGS. 2A and 2B illustrate a first and second embodiment of a unidirectional ESD protection device according to an aspect of the present disclosure.
Figure 2B:
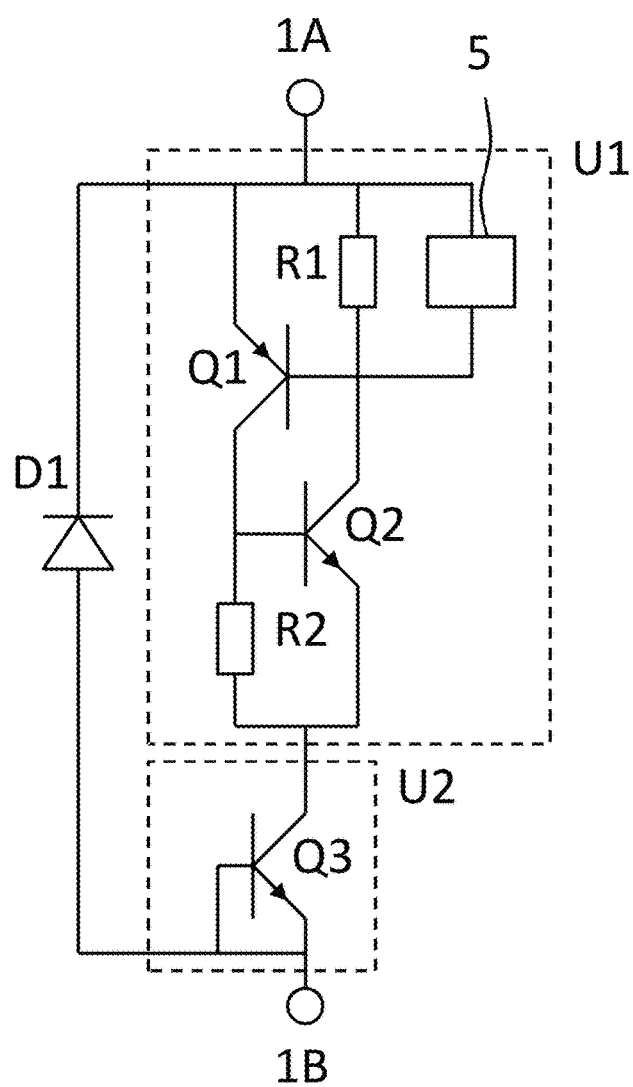

PNP transistor Q3 in FIG. 2A can be replaced by an NPN bipolar transistor as shown in FIG. 2B. Also in this case, the emitter and base of the transistor are shorted. Consequently, Q3 acts as an N-P junction.

Figure 3A:
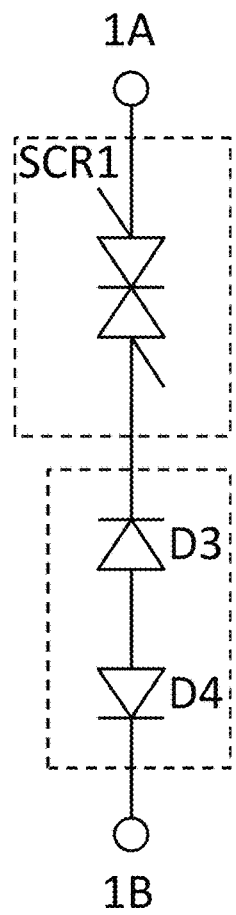
FIGS. 3A, 3B and 3C illustrate a first, second, and third embodiment of a bi-directional ESD protection device according to an aspect of the present disclosure.

FIG. 3A illustrates an embodiment of a bi-directional ESD protection device according to an aspect of the present disclosure. This protection device comprises a bi-directional SCR comprised in first unit U1. In second unit U2, a stack of oppositely arranged diodes D3, D4 are arranged for realizing I-V characteristics having a high trigger voltage for both polarities. These diodes can be realized using avalanche or Zener diodes.

Figure 3B:
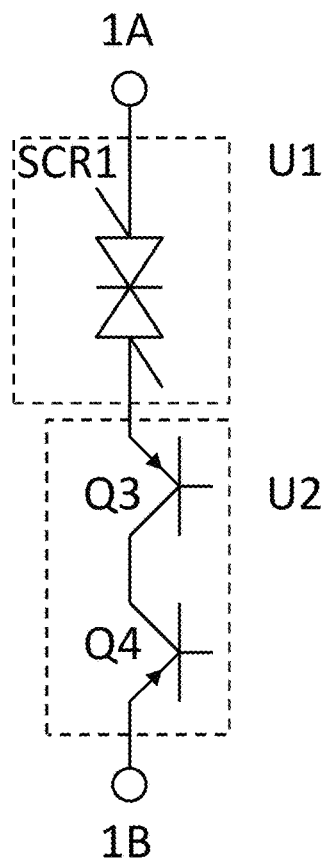

FIG. 3B illustrates that instead of using diodes D3, D4, a series connection of oppositely arranged open-base PNP bipolar transistors Q3, Q4 can be used. These transistors only show a marginal snapback so that the combination of the holding voltage of first unit U1 and the holding voltage of second unit U2 is higher than Vmax.

Figure 3C:
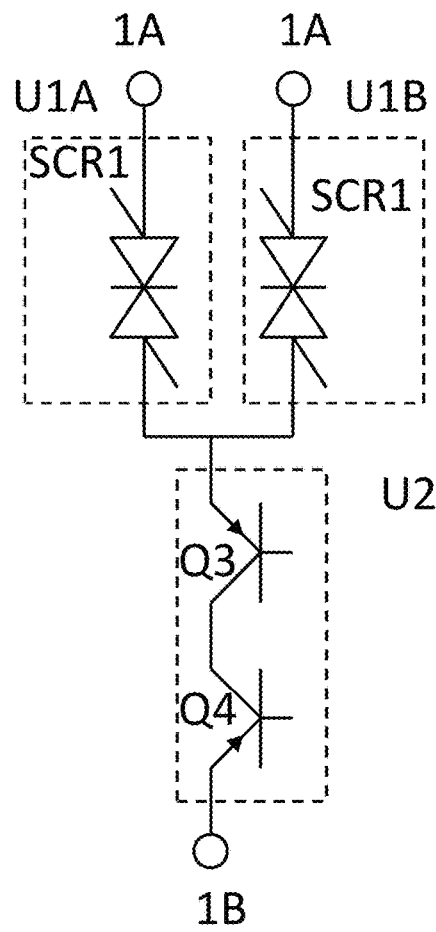

FIG. 3C is a two-channel equivalent of the ESD protection device shown in FIG. 3B. The two-channel device has two separate inputs that each connect a respective ESD sensitive node N to a respective first unit U1A, U1B, which are each identical or similar to first unit U1 of FIG. 3B. The ESD protection device of FIG. 3C is identical to two ESD protection devices as shown in FIG. 3B that share second unit U2.

FIG. 4A illustrates an embodiment of a unidirectional ESD protection device according to an aspect of the present disclosure. Here, first unit U1 comprises a series combination of a diode D2 and an open base NPN bipolar transistor Q1. Diode D2 is used to reduce the series capacitance of first unit U1 and Q1 is used for obtaining a strong snapback. Second unit U2 is identical or similar to that shown in FIG. 3B in that an open base PNP transistor Q3 is used.

FIG. 4B illustrates a bi-directional equivalent of the ESD protection device of FIG. 4A. The ESD protection device shown in FIG. 4B comprises two anti-parallel diodes D2, D5 as part of first unit U1. This unit further comprises two NPN bipolar transistors Q1, Q2 for obtaining a strong snapback in both current directions. Second unit U2 is configured identical or similar to second unit U2 of the ESD protection device shown in FIGS. 3B and 3C.

Figure 5:
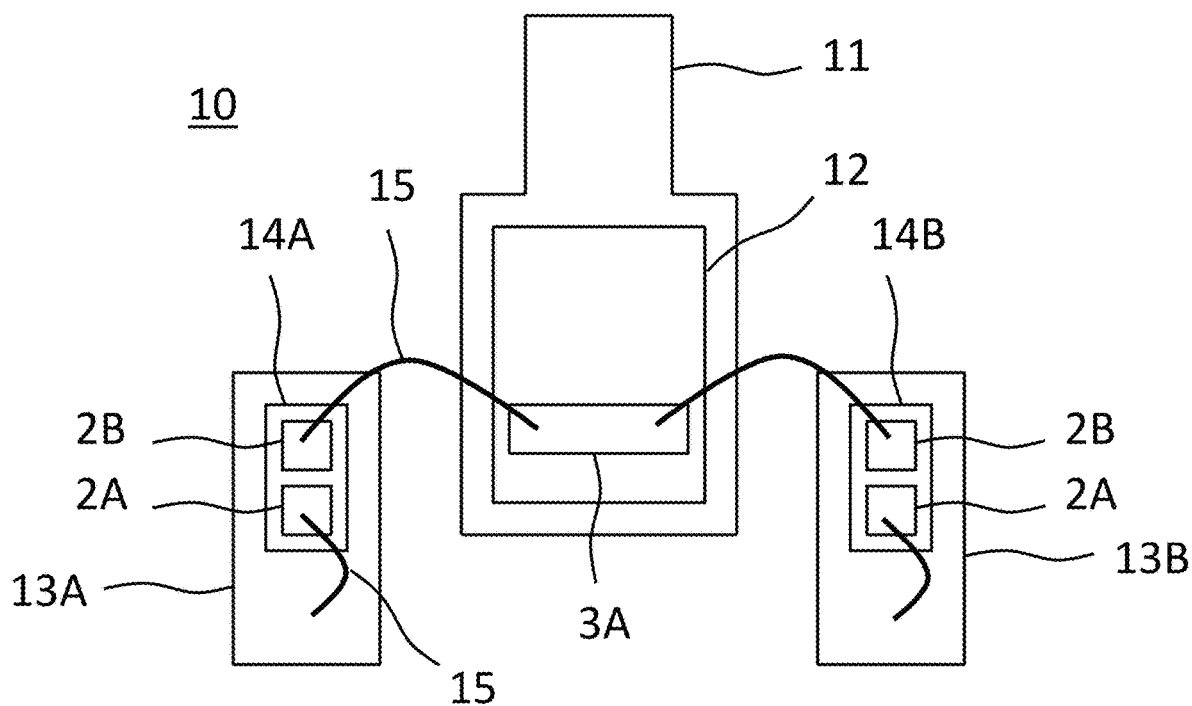
FIG. 5 illustrates an embodiment of a packaged ESD protection device according to an aspect of the present disclosure.

FIG. 5 illustrates a packaged ESD protection device 10 in accordance with an aspect of the present disclosure in which the ESD protection device of FIG. 3C is implemented. PNP bipolar transistors Q3, Q4 are integrated on a semiconductor die 12 as vertical devices, where the emitter of Q3 forming second terminal 3A is accessible as a die terminal at a top side of semiconductor die 12. The emitter of Q4 is arranged on a backside of semiconductor die 12. Generally, semiconductor die 12 comprises a conductive substrate and Q3, Q4 are high-voltage vertical devices.

Semiconductor die 12 is arranged on a package ground lead 11 of ESD protection device 10 in such a manner that the emitter of Q4 is electrically connected to package ground lead 11. ESD protection device 10 further comprises two semiconductor dies 14A, 14B. On each of these dies, a bi-directional SCR is integrated as a lateral device. The terminals 2A, 2B of these SCRs are accessible as die terminals on a top surface of semiconductor dies 14A, 14B.

As shown in FIG. 5, dies 14A, 14B are mounted on package leads 13A, 13B. One terminal 2B of each SCR is connected, using a bondwire 15, to the first terminal 3A of the second unit, which corresponds to the emitter of Q3. The other terminal 2A of each SCR is connected, using a bondwire, to package lead 13A, 13B. Here, it is noted that semiconductor dies 14A, 14B generally do not have conductive substrates. The electrical connection between the SCRs and the package leads is therefore only obtained using bondwires.

Figure 6:
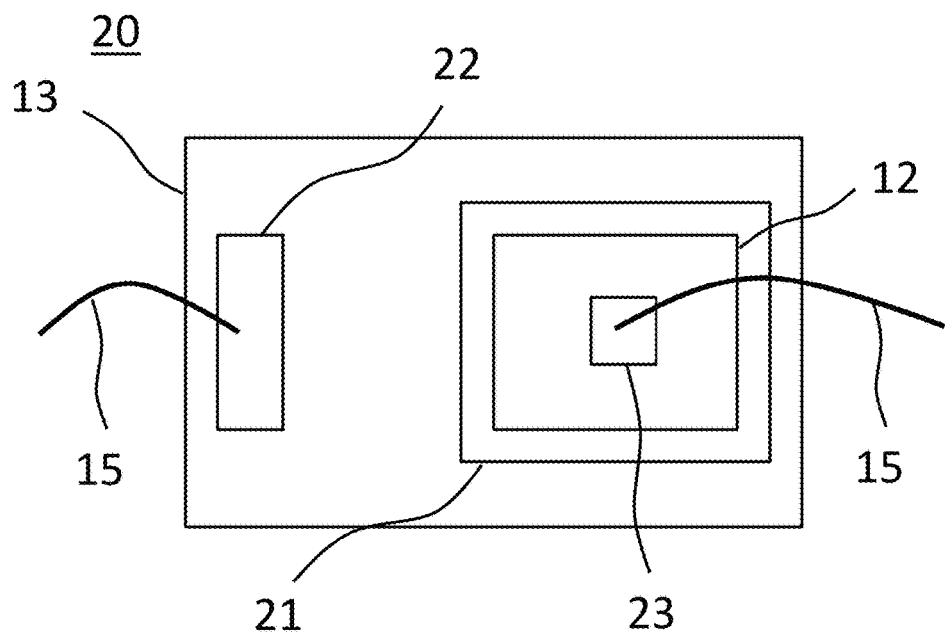
FIG. 6 illustrates an embodiment of a system-in-a-package according to an aspect of the present disclosure.

FIG. 6 illustrates a system-in-a-package 20 in accordance with an aspect of the present disclosure. It comprises a semiconductor die 12 in which vertical devices are integrated such as high voltage PNP or NPN bipolar transistors, and a semiconductor die 13 in which lateral devices are integrated such as SCRs. Semiconductor die 12, forming the second unit and having the first terminal of the second unit accessible on the rear surface and the second terminal of the second unit accessible as a bondpad 23 on the front surface of semiconductor die 12, is conductively mounted on a die pad 21 of semiconductor die 13. Die pad 12 is connected to or at least partially formed by the second terminal of the first unit, which first unit is integrated in semiconductor die 13. The first terminal of the first unit is connected to or at least partially forms a bondpad 22. The second terminal of the second unit is connected to the outside using a bondwire 15. Similarly, the first terminal of the first unit is connected to the outside also using a bondwire 15. Bondwires 15 could be connected to package leads, pads on a printed circuit board on which semiconductor die 13 is arranged, and the like.

Although FIGS. 5 and 6 illustrate embodiments in which separate semiconductor dies are used, the present disclosure equally relates to embodiments in which the first and second unit are integrated monolithically.

In the above, the present disclosure has been described using detailed embodiments thereof. However, the present disclosure is not limited to these embodiments. Instead, various modifications are possible without departing from the scope of the present disclosure which is defined by the appended claims and their equivalents.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalization thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. An electrostatic discharge (ESD), protection device, comprising:
    a node terminal configured to be connected to a node of a circuit to be protected;
    a reference terminal configured to be connected to a reference voltage, wherein the reference voltage is ground; and
    a series connection of a first unit and a second unit arranged in between the node terminal and the reference terminal;
    wherein the ESD protection device is configured to provide a conductive path between the node terminal and the reference terminal and through the series connection in case of an ESD event occurring on the node to be protected;
    wherein for a first current flow from one of the node terminals and the reference terminal to the other of the node terminal and the reference terminal:
        the first unit has I-V characteristics that display a first snapback that is described by a first trigger voltage and a first holding voltage;
        the second unit comprises a junction that is reverse biased for the first current flow, the reverse biased junction having I-V characteristics that are described by a second trigger voltage, and if these I-V characteristics display a second snapback, also by a second holding voltage;
    wherein the first unit has a first series capacitance and the second unit a second series capacitance, wherein the second series capacitance is at least 3 times greater than the first series capacitance; and
    wherein the second trigger voltage, or the second holding voltage if the I-V characteristics of the second unit display the second snapback, has a magnitude that is at least 3 times greater than a magnitude of the first holding voltage.

2. The ESD protection device according to claim 1, wherein the first unit comprises a first terminal connected to the node terminal, and a second terminal, and wherein the second unit comprises a first terminal connected to the second terminal of the first unit, and a second terminal connected to the reference terminal; or
    wherein the first unit comprises a first terminal connected to the reference terminal, and a second terminal, and wherein the second unit comprises a first terminal connected to the second terminal of the first unit and a second terminal connected to the node terminal.

3. The ESD protection device according to claim 1, wherein, if the I-V characteristics of the second unit display the second snapback, a ratio between the second trigger voltage and the second holding voltage is smaller than 2.

4. The ESD protection device according to claim 1, wherein the first unit comprises a lateral semiconductor device, and wherein the second unit comprises a vertical semiconductor device.

5. The ESD protection device according to claim 1, wherein the first unit comprises a silicon-controlled rectifier, or an electrical equivalent thereof.

6. The ESD protection device according to claim 1, wherein the first unit comprises a first open base NPN bipolar transistor and a first diode that is arranged in forward with respect to the first current flow, and wherein the first current flow corresponds to a current flow through the first diode and from the collector to the emitter of the first open base NPN bipolar transistor.

7. The ESD protection device according to claim 1, further comprising a bypass diode arranged in parallel to the series connection, wherein the bypass diode is arranged in reverse with respect to the first current flow.

8. The ESD protection device according to claim 1, wherein the second unit comprises:
    a stack of second diodes arranged in reverse with respect to the first current flow; or
    a first open base PNP bipolar transistor, wherein the first current corresponds to a current flow from the emitter to the collector of the first open base PNP bipolar transistor; or
    a second PNP bipolar transistor of which the emitter and base are interconnected, wherein the first current flow corresponds to a current flow from the base and/or emitter to the collector of the second PNP bipolar transistor; or
    a second NPN bipolar transistor of which the emitter and base are interconnected, wherein the first current flow corresponds to a current flow from the collector base to base and/or emitter of the second NPN bipolar transistor.

9. The ESD protection device according to claim 1, wherein for a second current flow from the other of the node terminal and the reference terminal to the one of the node terminals and the reference terminal:
    the first unit has I-V characteristics that display a third snapback that is described by a third trigger voltage and a third holding voltage;
    the second unit comprises a second junction that is reverse biased for the second current flow, the second reverse biased junction having I-V characteristics that are described by a fourth trigger voltage, and if these I-V characteristics display a fourth snapback, also by a fourth holding voltage;
    wherein the fourth trigger voltage, or of the fourth holding voltage if the I-V characteristics of the second unit display the fourth snapback, has a magnitude that is at least 3 times greater than a magnitude of the third holding voltage;
    wherein the first unit comprises a bi-directional silicon-controlled rectifier, or an electrical equivalent thereof; and/or
    wherein the first unit comprises a third open base NPN bipolar transistor and a third diode that is arranged in forward with respect to the second current flow, wherein the second current flow corresponds to a current flow from the collector to the emitter of the third open base NPN bipolar transistor and through the third diode; and/or
    wherein, if the I-V characteristics of the second unit display the fourth snapback, a ratio between the fourth trigger voltage and the fourth holding voltage is smaller than 2.

10. The ESD protection device according to claim 1, wherein the second unit comprises:
    a stack of fourth diodes arranged in reverse with respect to the second current flow; or a third open base PNP bipolar transistor, wherein the second current flow corresponds to a current flow from the emitter to the collector of the third open base PNP bipolar transistor; or a fourth PNP bipolar transistor of which the emitter and base are interconnected, wherein the second current flow corresponds to a current flow from the base and/or emitter to the collector of the fourth PNP bipolar transistor.

11. The ESD protection device according to claim 1, wherein the first trigger voltage and the second trigger voltage have a ratio that lies in a range between 0.5 and 5, and/or wherein the third trigger voltage and the fourth trigger voltage have a ratio that lies in a range between 0.5 and 5; and/or wherein the first trigger voltage lies in a range between 5 and 200V, and wherein the first holding voltage lies in a range between 0.8 and 15V, and/or wherein the third trigger voltage lies in a range between 5 and 200V, and wherein the third holding voltage lies in a range between 0.8 and 15V; and/or wherein the second trigger voltage lies in a range between 5 and 100V, and/or wherein the fourth trigger voltage lies in a range between 5 and 100V; and/or wherein the second trigger voltage and the second holding voltage have a ratio that lies in a range between 1 and 2, and/or wherein the fourth trigger voltage and the fourth holding voltage have a ratio that lies in a range between 1 and 2.

12. The ESD protection device according to claim 2, wherein, if the I-V characteristics of the second unit display the second snapback, a ratio between the second trigger voltage and the second holding voltage is smaller than 2.

13. A multi-channel ESD protection device, comprising:
a plurality of ESD protection devices according to claim 4, wherein the node terminals of the plurality of ESD protection devices are connected to a plurality of nodes to be protected, and wherein the reference terminals of the plurality of ESD protection device are connected to a common reference terminal;

wherein the second units of the plurality of ESD protection devices are formed by a single second unit that is shared among the plurality of ESD protection devices.

14. A packaged ESD protection device, comprising:
a package body;
at least one first package lead and a package ground lead partially extending outside the package body;
the ESD protection device according to claim 1, arranged inside the package body, of which the reference terminal is connected to the package ground lead and wherein the node terminal(s) is/are connected to the at least one first package lead;
wherein:
the first unit of the ESD protection device are realized on a respective first semiconductor die and the second unit on a separate second semiconductor die, wherein the first semiconductor dies comprise a substrate having arranged thereon a first die terminal forming the first terminal of the respective first unit and a second die terminal forming the second terminal of the respective first unit, wherein the second semiconductor die comprises a conductive substrate having a third die terminal forming the first terminal of the second unit arranged on a first side of the second semiconductor die and having a fourth die terminal forming the second terminal of the second unit arranged on a second side of the second semiconductor die opposite to the first side of the second semiconductor die, wherein the first die terminals are electrically connected, for example using a bondwire, to the first package leads, wherein the second die terminals are electrically connected, for example using a bondwire, to the third die terminal, and wherein the second semiconductor die is mounted with its fourth die terminal on the package ground lead.

15. A system-in-a-package, comprising:
the ESD protection device according to claim 1;
wherein the first unit of the ESD protection device is on a first semiconductor die and the second unit on a separate second semiconductor die, wherein the first semiconductor die comprises a substrate having arranged thereon a first die terminal forming the first terminal of the first unit and a second die terminal forming the second terminal of the first unit, wherein the second semiconductor die comprises a conductive substrate having a third die terminal forming the first terminal of the second unit arranged on a first side of the second semiconductor die and having a fourth die terminal forming the second terminal of the second unit arranged on a second side of the second semiconductor die opposite to the first side of the second semiconductor die, and wherein the second semiconductor die is mounted with its third die terminal on the second die terminal of the first semiconductor die;
the system-in-a-package further comprising:
a package body;
at least one first package lead and a package ground lead partially extending outside the package body;
wherein the first die terminal is connected to the first package lead, and wherein the fourth die terminal is connected to the package ground lead.

16. A packaged ESD protection device, comprising:
a package body;
at least one first package lead and a package ground lead partially extending outside the package body;
the multi-channel ESD protection device of claim 13, arranged inside the package body, of which the reference terminal is connected to the package ground lead and wherein the node terminal(s) is/are connected to the at least one first package lead;
wherein:
the first units of the multi-channel ESD protection device are realized on a respective first semiconductor die and the second unit on a separate second semiconductor die, wherein the first semiconductor dies comprise a substrate having arranged thereon a first die terminal forming the first terminal of the respective first unit and a second die terminal forming the second terminal of the respective first unit, wherein the second semiconductor die comprises a conductive substrate having a third die terminal forming the first terminal of the second unit arranged on a first side of the second semiconductor die and having a fourth die terminal forming the second terminal of the second unit arranged on a second side of the second semiconductor die opposite to the first side of the second semiconductor die, wherein the first die terminals are electrically connected, for example using a bondwire, to the first package leads, wherein the second die terminals are electrically connected, for example using a bondwire, to the third die terminal, and wherein the second semiconductor die is mounted with its fourth die terminal on the package ground lead.

17. A system-in-a-package, comprising:
the multi-channel ESD protection device of claim 13;

wherein the first unit of the ESD protection device is on a first semiconductor die and the second unit on a separate second semiconductor die, wherein the first semiconductor die comprises a substrate having arranged thereon a first die terminal forming the first terminal of the first unit and a second die terminal forming the second terminal of the first unit, wherein the second semiconductor die comprises a conductive substrate having a third die terminal forming the first terminal of the second unit arranged on a first side of the second semiconductor die and having a fourth die terminal forming the second terminal of the second unit arranged on a second side of the second semiconductor die opposite to the first side of the second semiconductor die, and wherein the second semiconductor die is mounted with its third die terminal on the second die terminal of the first semiconductor die;

the system-in-a-package further comprising:

a package body;

at least one first package lead and a package ground lead partially extending outside the package body;

wherein the first die terminal is connected to the first package lead, and wherein the fourth die terminal is connected to the package ground lead.

18. An electronic device, comprising:

an electrostatic discharge, ESD, sensitive electric circuit having an ESD sensitive node, wherein the sensitive node is an input terminal, output terminal, data terminal or the like; and the ESD protection device according to claim 1, wherein the ESD sensitive node is electrically connected to the node terminal of the ESD protection device, and wherein the reference terminal of the ESD protection device is electrically grounded at least during operation.

\* \* \* \* \*